United States Patent
Sill

(10) Patent No.: US 6,284,110 B1
(45) Date of Patent: Sep. 4, 2001

(54) METHOD AND APPARATUS FOR RADIO FREQUENCY ISOLATION OF LIQUID HEAT TRANSFER MEDIUM SUPPLY AND DISCHARGE LINES

(75) Inventor: Edward L. Sill, Phoenix, AZ (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/291,890

(22) Filed: Apr. 14, 1999

(51) Int. Cl.$^7$ .................................................. C23C 14/34
(52) U.S. Cl. ...................... 204/298.09; 118/58; 156/345; 165/177; 165/181; 165/184
(58) Field of Search ................... 204/298.09; 118/58; 156/345; 165/181, 184

(56) References Cited

U.S. PATENT DOCUMENTS

| 4,849,675 | 7/1989 | Müller | 315/111.51 |
|---|---|---|---|
| 5,334,302 | * 8/1994 | Kubo et al. | 204/298.18 |
| 5,628,889 | * 5/1997 | Gardell et al. | 204/298.09 |
| 5,660,740 | * 8/1997 | Komino | 216/67 |
| 5,906,683 | * 5/1999 | Chen et al. | 118/724 |
| 5,935,396 | * 8/1999 | Buckfeller et al. | 204/298.09 |

FOREIGN PATENT DOCUMENTS

| 0184812 A | 6/1986 | (EP) | H05H/1/46 |
|---|---|---|---|
| 0596551 A | 5/1994 | (EP) | H01J/37/32 |
| 0887836 A | 12/1998 | (EP) | H01J/37/32 |
| 58045378 A | 3/1983 | (JP) | C23L/15/00 |
| 10303132 A | 11/1998 | (JP) | H01L/21/205 |
| 9742648 A | 11/1997 | (WO) | H01J/37/32 |

\* cited by examiner

*Primary Examiner*—Nam Nguyen
*Assistant Examiner*—Steven H. Ver Steeg
(74) *Attorney, Agent, or Firm*—Wood, Herron & Evans, LLP

(57) ABSTRACT

A passive first-order band reject, or notch, filter characteristic is introduced into a supply and/or return line (18, 20) of a heat transfer system (12) that uses electrically conductive liquid heat transfer medium in contact with radio frequency electrified components (14) typical in sputtering or etching manufacturing equipment. The heat transfer medium line (20) is coiled to create an inherent inductance (L2). A capacitive element (C2) is operatively connected across the coil (29) in the heat transfer medium line (20), the amount of capacitance chosen so that the resonant frequency is at the RF frequency of the components (14) being thermally conditioned. Thus, a high impedance is created for that frequency. The coil (29) and capacitor (C2) combination is protected from physical and electromagnetic interference by an enclosure (44).

16 Claims, 5 Drawing Sheets

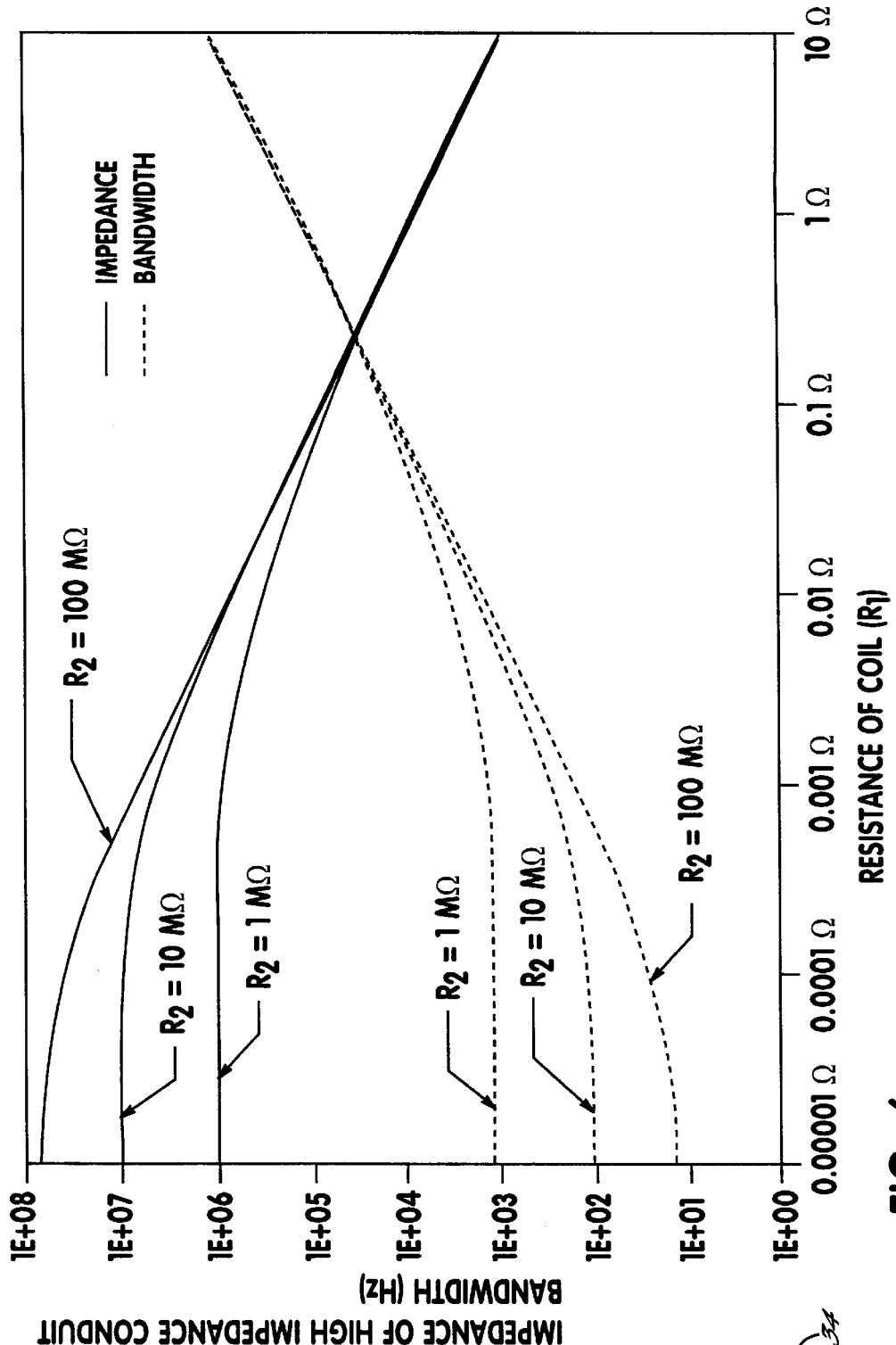
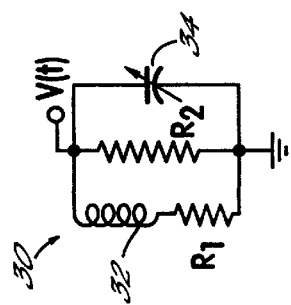
FIG. 5

METHOD AND APPARATUS FOR RADIO FREQUENCY ISOLATION OF LIQUID HEAT TRANSFER MEDIUM SUPPLY AND DISCHARGE LINES

FIELD OF THE INVENTION

The present invention pertains to radio frequency isolation to heat transfer supply and discharge lines through which electrically conductive heat transfer medium flows. More particularly, the present invention pertains to high-impedance heat transfer supply and discharge lines for use in sputtering and etching equipment used in the semiconductor industry.

BACKGROUND OF THE INVENTION

Sputter coating is a coating process that involves the transport of almost any material from a source, called the target, to a substrate of almost any material. The process takes place in a reduced pressure chamber containing argon or other process gas. The reduced pressure, or vacuum, is needed to increase the distance that the sputtered atoms can travel without undergoing collision with each other or with other particles. The argon gas is ionized which results in a bluish-purple glow of a plasma. Ejection of target source material is accomplished by bombardment of the target surface with gas ions that have been accelerated toward the target by a high voltage. As a result of momentum transfer between incident ion and target, particles of atomic dimension are ejected from the target. These ejected particles traverse the vacuum chamber and are subsequently deposited on a substrate as a thin film. A similar process is generally used in sputter etching, however, the target is replaced by the object to be etched.

Radio frequency (RF) power, introduced into a process chamber via an inductive coil encircling the chamber, is often advantageously used in sputter coating and etching to enhance the development of the plasma. RF sputter coating and etching allows the deposition of insulating as well as conductive materials and the etching of substrates, utilizing lower voltages, such as 500 to 2,500 V, to accelerate the argon gas ions to the target or substrate being etched. The lower voltage at the same power provides higher deposition and etching rates with reduced substrate damage. In addition, RF power may be used to bias the substrate to change the characteristics of film deposition, especially for insulating films. Such RF power biasing of the substrate can improve adhesion and the added heat due to the bias power can provide higher mobility of source material on the substrate surface which can improve step coverage. Lower resistivity and changes in film stress can be obtained with RF voltage bias, as well. Gas incorporation into the film is usually increased. Oxide films such as silicon dioxide will have improved optical qualities and higher density when RF bias is used during deposition.

Electronically isolating certain system components with respect to RF energization is desirable when using RF power in sputtering and etching. Otherwise, the plasma may be altered, adversely affecting the sputtering or etching process. In the case of RF biasing of the substrate, lack of RF isolation can result in undesired RF power dissipation. Consequently, it is desirable to RF isolate certain components within a sputtering or etching system. This RF isolation provides an interruption of a potential RF path to ground from the RF energized component.

Another aspect of sputtering and etching systems is the requirement to thermally condition (heat or cool) certain system components or the substrate. This is usually accomplished by circulating a liquid heat transfer medium in heat transfer relationship to the system component, or substrate support, as the case may be. As previously mentioned, the substrate may be biased by RF power for improved deposition or etching characteristics. Under such conditions, the heat transfer components must be electrically isolated from the RF applied to the substrate support. For example, in sputter coating target cooling is often desirable, whereas in sputter etching wafer cooling may be needed. In such situation, a liquid coolant is circulated through the susceptor or wafer support, as the case may be. In wafer processing configurations wherein an RF coil is placed around the sputtering or etching chamber to create and/or enhance the plasma, the RF coil has resistance that generates heat, requiring the RF coil to be cooled by circulating a liquid heat transfer coolant medium through the RF coil. The heat transfer component must be isolated from the RF applied to the RF coil.

A problem arises when cooling an RF coil and/or heating or cooling a substrate support or target holder as a result of the fact that the heat transfer media, usually water, in the lines used for circulating the heat transfer media through the coil or substrate support or target interferes with RF isolation of components such as the RF coil, substrate support, target holder, etc. Maintaining the desired RF isolation while circulating a liquid heat transfer medium is required to prevent degradation of the sputtering or etching process.

Water is typically used as the heat transfer liquid medium due to the safety, low cost, and ready availability of water. For example, in a simple open cooling system, cool tap water is supplied through a supply line to the sputtering or etching system component to be cooled at which place the water is circulated and thereafter discharged to a drain via a discharge line. Tap water typically contains dissolved minerals that cause the water to be less chemically reactive to many materials. However, the dissolved minerals also create ions in the water that make the water electrically conductive, which can be disadvantageous when heating or cooling sputtering or etching system components energized with RF. Consequently, in many applications, the electrically conductive tap water is first purified to remove the minerals, making it resistive. Resistive water is corrosive to many materials such as metals. As a consequence, a balance is sought in the level of water purification to achieve an acceptable level of conductivity versus corrosiveness. In addition, chemical additives are generally added to the water to mitigate the corrosive effects, incurring additional expense and inconvenience in preparation and disposal of the liquid. These additives in some instances introduce detrimental effects such as reducing the resistivity of the water or decreasing the environmental safety of the liquid. Moreover, systems utilizing this type of component cooling or heating have to be designed to accommodate a certain amount of electrical power loss through the liquid heat transfer medium.

Achieving the requisite balance in water purity involves the expense of buying or processing the water to the appropriate purity level. Filtering and monitoring of the water is then required to maintain the purity within the acceptable range. Even with these additional requirements, there is still some degradation of performance and reliability of the components heated or cooled by the resistive water.

Other relatively abundant and environmentally safe heat transfer liquids are also available; however, many of these are also electrically conductive, but by their nature cannot be processed to a more resistive condition and are thus inappropriate for use.

Relying on the resistivity of the water to provide the RF isolation dictates that the water supply and discharge lines be increased in length, since the electrical resistance afforded by the water is a function of water path length to ground, assuming the resistivity of the water and diameter of the water lines are fixed. For example, typical resistive water cooling systems employ 12 to 13 feet of polypropylene tubing of about a quarter inch in outer diameter in each of the water supply and discharge lines to generate 1 MΩ of resistance.

Consequently, what is needed are high impedance liquid heat transfer medium supply and discharge lines that are not dependent principally upon the resistivity of the heat transfer liquid in isolating radio frequency energized components.

SUMMARY OF THE INVENTION

These and other needs are satisfied in accordance with certain principles of the present invention by a) coiling at least a portion of the liquid heat transfer medium supply and/or discharge lines such that the lines have a high inherent inductance and b) connecting a capacitive element in parallel with the coiled lines, with the capacitance being chosen such that the resonant frequency, and thus the highest impedance, of the coiled line /capacitor combination occurs at the RF frequency in use.

The present invention, by virtue of being a passive device, requires no power source, and is less sensitive to variations in the electrical conductivity of the liquid, thus eliminating expensive liquid processing and filtering. Other advantages include reducing the length of liquid heat transfer medium supply and discharge lines normally employed.

These and other objectives and advantages of the present invention will be more readily apparent from the following detailed description of the embodiments.

BRIEF DESCRIPTION OF THE DRAWINGS

FIG. 5 is an equivalent electrical schematic of a high impedance line wherein the electrical resistance of the components is shown.

FIG. 6 is a plot of the impedance and bandwidth of the high impedance line of FIG. 5 shown as a function of the resistance of the coil, illustrating that as DC resistance of the coil increases and/or resistance of an additional resistor in parallel to the coil increases, the peak impedance decreases and the bandwidth widens.

DETAILED DESCRIPTION OF THE INVENTION

Figure 1:
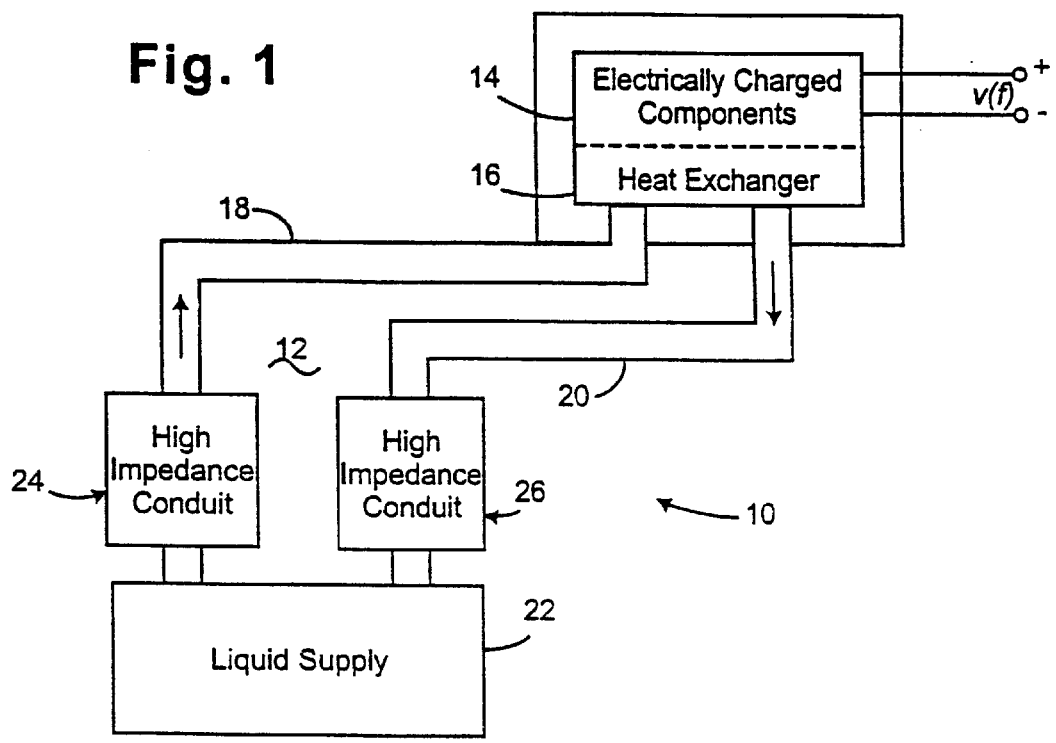
FIG. 1 is a block diagram of liquid cooled or heated system component having high impedance liquid heat transfer medium supply and discharge lines.

FIG. 1 diagrammatically illustrates a thermally conditioned system 10 having a closed heat transfer system 12 for heating or cooling one or more electrically charged components 14. A heat exchanger 16 brings a liquid heat exchange medium, such as water, into thermal and electrical contact with the electrically charged components 14. The heat exchanger 16, for example, may be metal tubing (not shown) placed in physical contact with the components 14 or in contact with a thermally conducting material (not shown) located between, and in heat transfer contact with, the tubing and the components 14. The closed heat transfer system 12 has a liquid supply line 18, and a liquid return heat line 20, generally referred to as water lines. The liquid is processed and pressurized by a liquid supply 22. Interposed in the lines 18, 20 are high impedance liquid conduits 24, 26 constructed in accordance with the principles of the invention.

Figure 2:
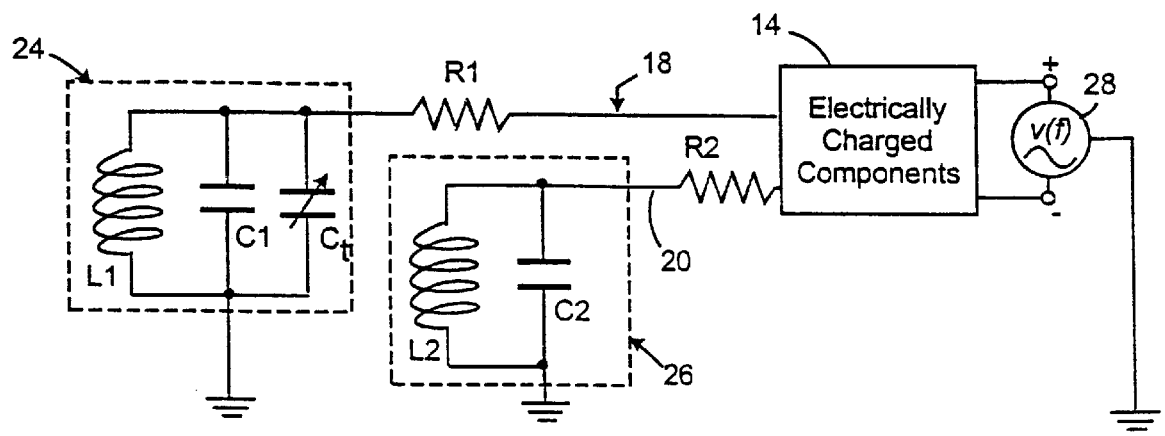
FIG. 2 is an electrical schematic of the liquid cooled or heated system component of FIG. 1 wherein the high impedance liquid heat transfer medium lines are shown in both a fixed capacitance and variable capacitance embodiment.

FIG. 2 shows an electrical schematic for the system 10 of FIG. 1. The electrically charged components 14 are shown as being electrified by a sinusoidal power supply 28 having an output v(f), where the frequency f is generally in the radio frequency (RF) band. The supply heat transfer medium line 18 is shown having a known resistivity R1 and the return supply line 20 is shown having a known resistance R2, these values being a function of the resistivity of the liquid in the lines 18 and 20, the length and diameter of the lines 18, 20, and the resistivity of the material from which the lines 18 and 20 are made.

The high impedance conduit 24 is shown as having an inductor L1 electrically in parallel with the parallel combination of a fixed capacitor C1 and a trim capacitor $C_t$. Parallel capacitances are additive. Therefore, a small trim capacitor can adjust the equivalent capacitance for the overall capacitive element. Capacitors are electrical circuit elements used to store electrical charge temporarily, typically comprising conductors separated by a dielectric. Consequently, capacitors C1 and $C_t$ contribute to electrical characteristics but not to fluid flow characteristics of the high impedance conduit 26.

The return high impedance conduit 26 is shown as having an inductor L2 in parallel with a fixed capacitor C2. Both conduits 24, 26 are referenced to ground. The embodiments shown in FIG. 2 are exemplary and other embodiments are contemplated. For instance, a single variable capacitor could be used, or a plurality of fixed capacitors in parallel could be used, to achieve the desired equivalent capacitance.

The resistance values of R1 and R2 would dictate the electrical power loss through the lines 18, 20 but for the introduction of the high impedance conduits 24, 26. However, the contribution of the resistance values of R1 and R2 can be discounted as negligible as compared to the conduits 24, 26, which would have the equivalent impedance of:

$$Z_{eqv} = \frac{(Z_L * Z_C)}{(Z_L + Z_C)}$$

Where $Z_L$ is the impedance of an inductor (i.e., $j2\pi fL$) and $Z_c$ is the impedance of the capacitor (i.e., $1/j2\pi fC$). This equivalent impedance $Z_{eqv}$ is maximized at the resonant frequency $f_R$ the inductor—capacitor combination, which can be calculated as:

$$f_R = \frac{1}{2\pi\sqrt{LC}}$$

Figure 3:
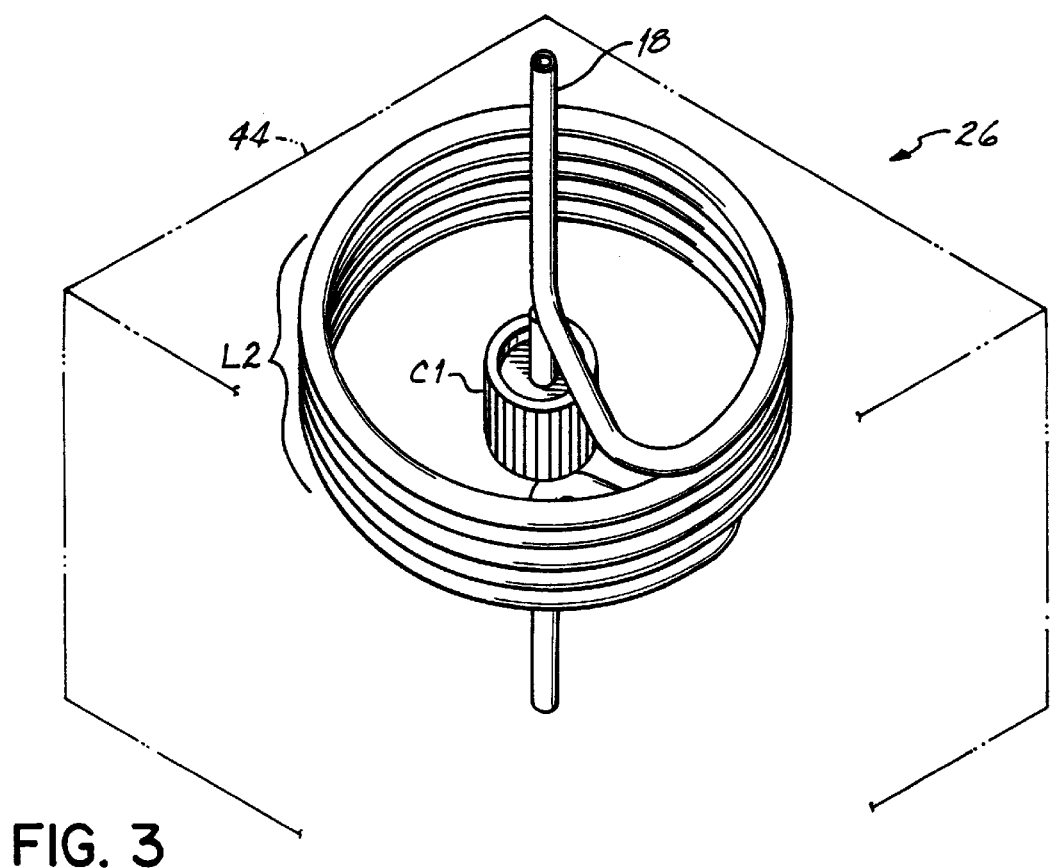
FIG. 3 is a diagrammatic perspective view of a fixed capacitance embodiment of a high impedance line of FIGS. 1 and 2.
Figure 4:
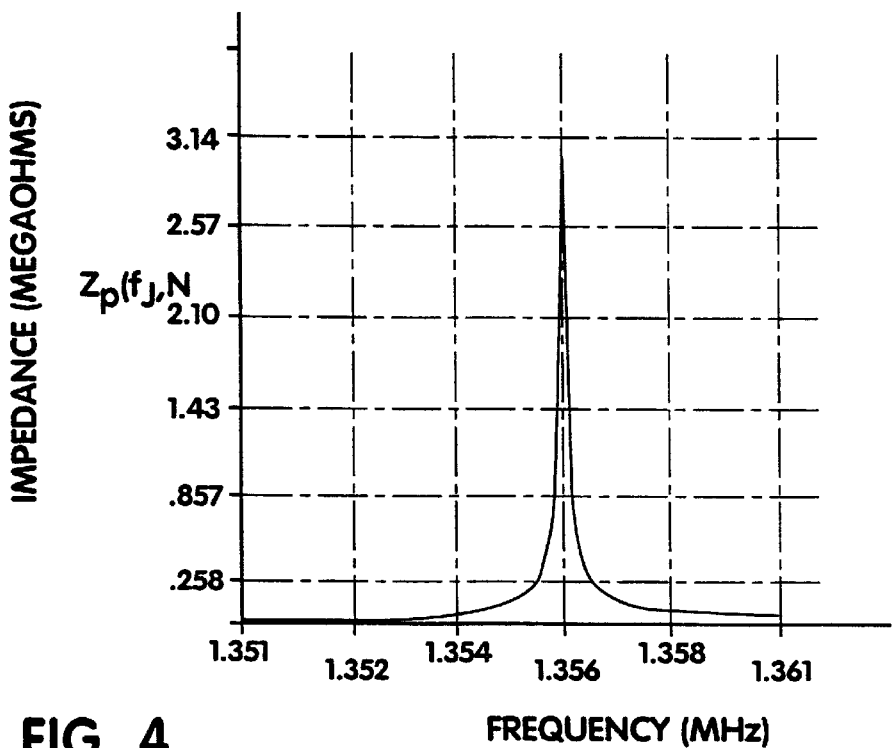
FIG. 4 is a plot of impedance as a function of frequency for an illustrative embodiment.

In the illustrative embodiment shown in FIG. 3, the adjustable high impedance conduit 26 is designed for the resonant frequency of 13.56 MHz, one of the standard frequency used in the industry exciting the argon gas in etching and sputter deposition systems. Lower frequencies, such as 450 kHz, are often used when exciting inductively couple plasmas. The water line 20 may be of an electric insulative material tubing of about a quarter inch in outer diameter. The water line 20 is coiled into a five-turn coil L2 of two inch outer diameter, resulting in an inductance value of about 1.0 mH. More turns for the coil 29 could be chosen to increase the impedance but this would trade off higher impedance for a narrower bandwidth of a high impedance region and would also increase the overall length of the coil 29. An enclosure 44 surrounds the coil 29, providing protection from physical damage to the coil 29. Preferably, the enclosure 44 would be a grounded Faraday RF shield, a conductive enclosure that protects internal components from external electromagnetic radiation and reduces emission of electromagnetic radiation from the coil 29 to the external environment. A capacitor C2 of 332 pF is operatively placed across the coil 29. Electrical connection between the liquid and the capacitor C2 could be achieved in numerous ways. For instance, an electrical conductor could be inserted through the water line 20. Also, the coil could have metal connectors at each end to aid in assembly and capacitor C2 could contact these connectors. Preferably, the capacitor C2 and connections to the coil 29 would be insulated. These inductance and capacitance values result in an impedance for the high-impedance conduit of over 30 MΩ, as shown in FIG. 4. This value compares to a requirement of 900 feet of water line 20 to achieve a comparable impedance if merely coiling the water line 20 without the capacitor C2.

Referring to FIG. 5, an equivalent electrical schematic is shown for a high impedance conduit 30 wherein the electrical resistance of the components is considered. A first resistor $R_1$, shown in series with coil 32, models the resistance of the coil 32 and liquid therein. For example, the coil 32 may be of conductive material resulting in a low value for first resistor $R_1$. Alternatively, the coil 32 may be of insulative material such that $R_1$ results from the characteristics of the liquid, and thus $R_1$ has a higher resistance value. A second resistor $R_2$, in parallel to the series combination of the coil 32 and first resistor $R_1$, represents an additional resistor added to a high impedance conduit 30 to control the peak impedance and bandwidth. The trimmable capacitor 34 is shown in parallel with the series combination of the coil 32 and first resistor $R_1$. A second resistor $R_2$ is shown in parallel to the series combination of the coil 32 and first resistor $R_1$ and also in parallel to the trimmable capacitor 34. Second resistor $R_2$ represents an additional resistor added to a high impedance conduit 30 to control the peak impedance and bandwidth, or accounts for resistance characteristics of trimmable capacitor 34.

Consideration of the resistance of the coil 32 may be required, for example, in selecting an appropriate RF power supply (not shown) to a component in a sputtering or etching system, for instance, when the specific amount of electrical power dissipated by the heat transfer system 12 is critical. As another example, the frequency of the RF power supply may not be constant, thus dictating a wider operable bandwidth of the high impedance conduit 30. Consequently, the full electrical response of the heat transfer system 12 considering resistance provides a more accurate prediction. Design choice, such as choice of capacitive element 34 with appropriate resistive characteristics, may be made for the desired peak impedance and width of band reject characteristics.

Referring to FIG. 6, a plot of the impedance and bandwidth of the high impedance conduit 30 of FIG. 5, illustrating that as DC resistance $R_1$ of the coil 32 increases or the additional resistance of a second resistor $R_2$, in parallel to coil 30, decreases, the peak impedance decreases and the bandwidth increases of the high impedance conduit 30.

Figure 7:
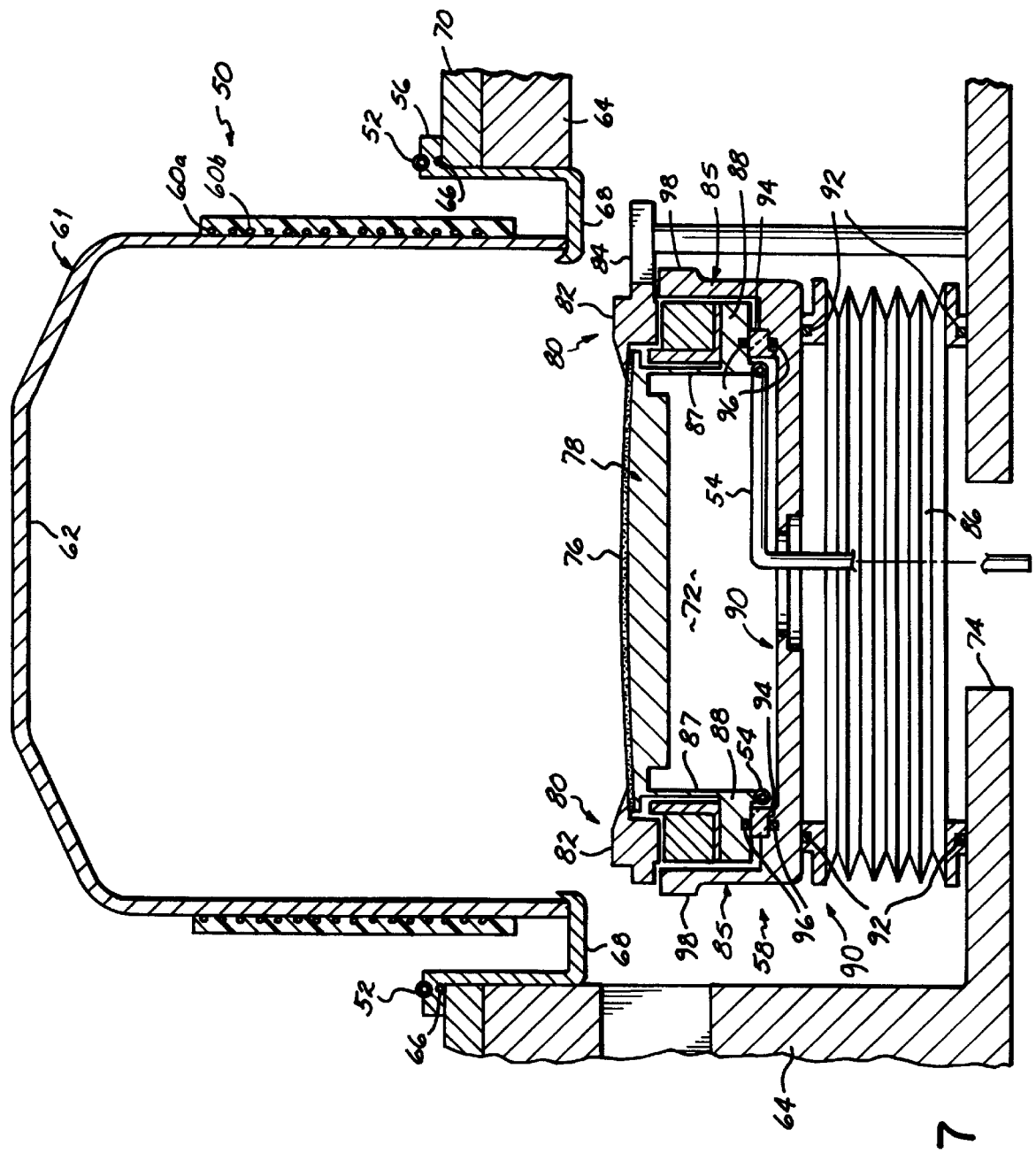
FIG. 7 is a cross sectional depiction of a soft etching system utilizing liquid cooling of an RF coil and a wafer support, with the cooling supply and discharge lines appropriate candidates for the high impedance lines of this invention.

Referring to FIG. 7, a cross sectional depiction is shown of a soft etching system 50 utilizing water coolant heat transfer lines 52, 54 for a housing seal 56, and for a wafer support 58, respectively. An RF coil 60a for enhancing the plasma, shown encircling the bell jar vacuum process chamber 62, is water-cooled copper tubing, the copper providing an electrical conductor for the RF power, with the frequency of the RF power being 450 kHz. The RF coil 60a is a portion of a heat transfer line 60b shown and discussed below for FIG. 8.

A high vacuum is maintained within the enclosure 61 formed by a bell jar vacuum process chamber 62 and aluminum housing 64, in part by an o-ring seal 66 between an aluminum support 68 and a stainless steel flange 70 of the aluminum housing 64. High vacuum is maintained at the contact between the bell jar 62 and the aluminum support 68 by a high temperature VITON o-ring (not shown). To prevent thermal damage to the o-ring seal 66, cooling water is delivered to the support 68 by heat transfer line 52. Heat transfer line 52, however, is not an appropriate candidate for high impedance circuits since the line 52 is at ground potential.

Heat transfer line 54 is an appropriate candidate for high impedance conduits since line 54 is near RF energized components.

The wafer support 58 has an internal volume 72 open to atmospheric pressure through its downward opening 74. A silicon wafer 76 sets upon an RF energized table 78, the RF energy biasing the wafer 76, with the RF power supplied having a frequency of 13.56 MHz.

Wafer hold-down components 80 are similarly RF energized and provide physical support to the quartz clamp 82 holding down the silicon wafer 76. The quartz clamp 82 is held in position by support 84 beside the wafer receptacle 58. The upper portion of wafer receptacale 58, the susceptor 85, is raised to contact the clamp 82 and lowered to allow placement of a wafer 76 on the table 78 by actuating the bellows like lower portion 86 of the wafer receptacle 58.

The table 78 has a downwardly extending thin flange 87, made thin to minimize heat loss from the top of the heated table 78 to the base 88 of the heated table 78, which provides physical contact and support to the wafer hold-down components 80. The base 88 in turn is supported by a receptacle support 90, generally made of stainless steel, which for ease of manufacturing is shown composed of a plurality of components. Internal seals 92 are thus provided to prevent atmospheric pressure in the internal volume 72 from escaping to the enclosure 61. RF isolation between the RF energized base 88 and the receptacle support 90 is provided by ceramic flange 94. Seals 96 prevent atmospheric pressure from escaping past the ceramic flange 94. The bottom of the flange 87 of the heated table 78 is positioned near the ceramic flange 94 and its seals 96. The flange 87 is susceptible to damage due to heat as are the seals 96. Consequently, the cooling water line 54 is provided at this point.

The importance of isolating RF power in the soft etching system 50 is shown by the addition of RF insulating ring 98, a portion of the receptacle support 90 in close non-touching proximity to the wafer hold-down components 80. The space between the RF insulating ring 98 and the wafer hold-down components 80 is so small as to form a dark space shield, a space too small to allow the formation of a plasma. Similarly, isolating heat transfer lines 52, 54, and 62 is necessary to prevent RF power from generating plasma, or otherwise conducting power to ground, at other locations.

The soft etching system 50 is exemplary, with other sputter coating and sputter etching systems having heat transfer lines and RF powered components similarly being candidates for high impedance conduits.

Figure 8:
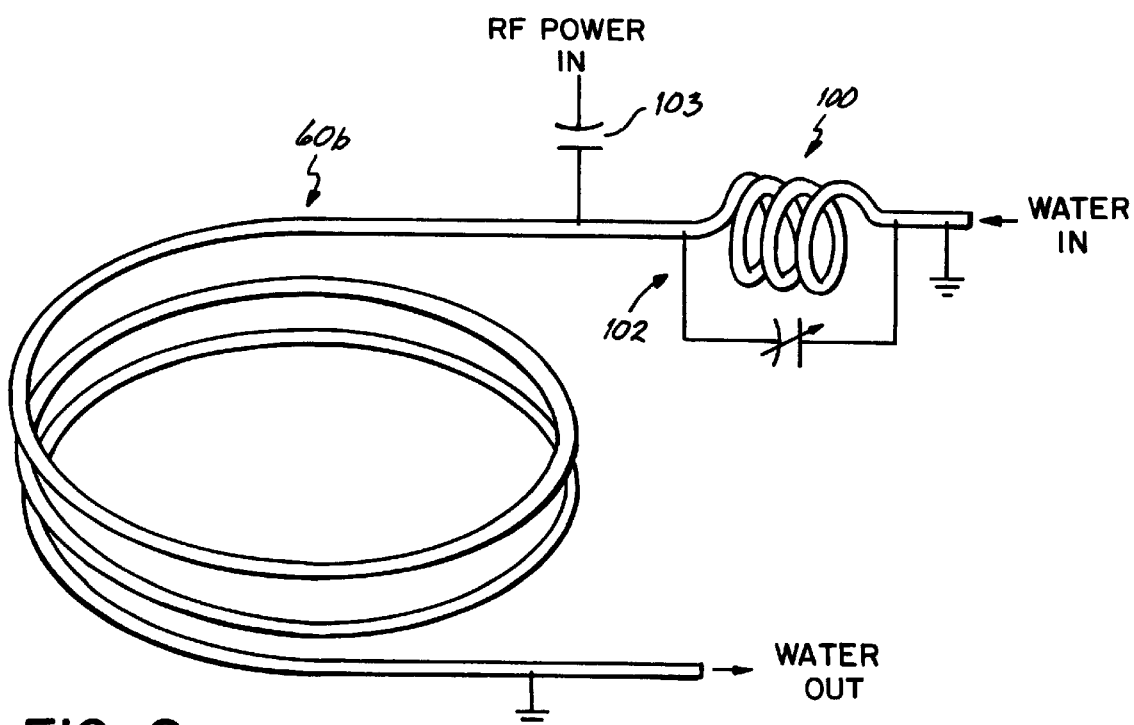
FIG. 8 is a depiction of the cooling line to the RF coil incorporating a high impedance conduit on the supply side.

Referring to FIG. 8, the cooling line 60b to the RF coil 60a is shown incorporating a high impedance conduit 100 on the supply side 102. The cooling line 60b is energized by RF power as represented by capacitive coupling 103.

Figure 9:
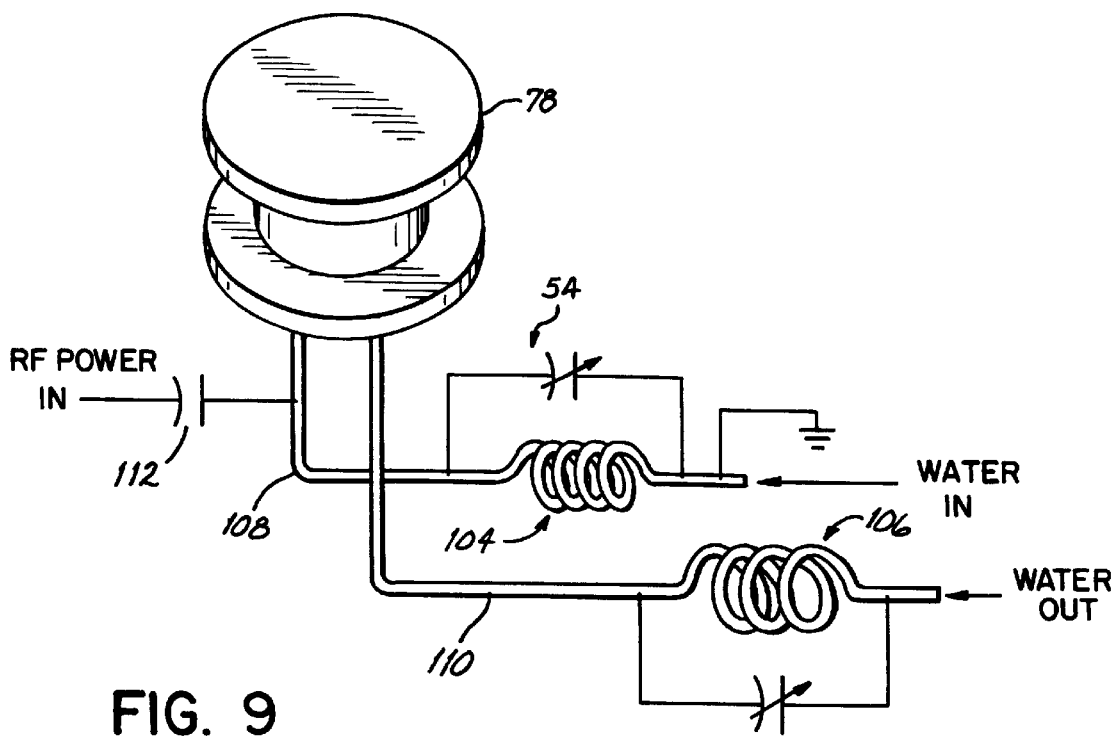
FIG. 9 is a depiction of the cooling line to the wafer support, incorporating a high impedance conduit to both the supply and discharge sides.

Referring to FIG. 9, the cooling line 54 to the heated table 78 is shown incorporating high impedance conduits 104, 106 to both the supply side 108 and discharge side 110, respectively. The cooling line 54 is energized by RF power as represented by capacitive coupling 112.

Although the embodiments described utilize passive capacitive elements to create a first-order notch filter, it would be further consistent with the invention to utilize active elements such as operational amplifiers. In addition, it would be further consistent with the invention to create higher-order notch filters or other filtering characteristics. For example, the sputtering or etching system may have components energized by an RF power source capable of varying the frequency of the RF power. Active components within a high impedance conduit can be employed to tune the impedance to correspond to the frequency of the RF power. In addition, the RF power present in the sputtering or etching system could have more than one frequency, such as the RF coil enhancing the plasma being at one frequency whereas RF bias to the substrate being at another frequency. Thus, a high impedance conduit could be provided with a broader bandwidth or with several notch filters tuned to these frequencies of interest such as with a higher order filter. Alternatively, a plurality of high impedance conduits, each blocking an RF frequency, could be placed in series to achieve a multiple notch or broader bandwidth high impedance.

Moreover, although the capacitive element is shown as physically placed down the longitudinal axis of the coil, many orientations would be acceptable so long as the capacitive element is electrically in parallel with the coil.

In addition, although the preferred embodiments as shown are used in cooling or heating components of sputtering systems, the invention is useful in chemical vapor deposition systems and ionized physical vapor deposition systems incorporating sources of RF energy.

As described herein, open and closed system heat transfer systems 12 are appropriate for high impedance conduits. An open system includes having one liquid path, either the input to or the output from the device being cooled or heated, electrically isolated between the electrical power source and the device being cooled. As such, the high impedance conduit is omitted on that isolated liquid path. For example, tap water is pumped into a heat exchanger, requiring the high impedance conduit, whereas the output from the heat exchanger has such a long drain path through an insulating conduit that the resistivity of the cooling water is sufficient for electrical isolation. Alternatively, the output is discretely discharged in a fashion where no continuous short to ground exists.

Those skilled in the art will appreciate that the implementation of the present invention herein can be varied, and that the invention is described in preferred embodiments. For example, although a cooling system is described in detail, a high impedance conduit would be similarly employed for heating. Accordingly, additions and modifications can be made, and details of various embodiments can be interchanged, without departing from the principles and intentions of the invention.

What is claimed is:

1. A high impedance liquid heat transfer medium conduit configured for a heat transfer system using heat exchange medium in thermal and electrical contact with a component to be thermally conditioned which is energized by radio frequency power of a predetermined frequency, the conduit comprising:
   a coiled liquid heat transfer medium line; and
   a capacitive element operatively connected in parallel with the coiled liquid heat transfer medium line, the coiled line and capacitive element collectively constituting a parallel LC circuit resonant at a frequency approximating the predetermined frequency.

2. The high impedance conduit of claim 1, wherein the heat exchange medium is water.

3. The high impedance conduit of claim 1, wherein the capacitive element further comprises a variable capacitor such that the capacitance can be varied to tune the LC circuit to resonate at the predetermined frequency.

4. The high impedance conduit of claim 3, wherein the variable capacitor includes a fixed capacitor in parallel with a trim capacitor.

5. The high impedance conduit of claim 1, wherein the resonant frequency is approximately 13.56 MHz.

6. The high impedance conduit of claim 1, wherein the resonant frequency is approximately 450 kHz.

7. The high impedance conduit of claim 1, further comprising a protective enclosure surrounding the coiled liquid heat transfer medium line and the capacitive element.

8. The high impedance conduit of claim 1, wherein the capacitive element and the coiled liquid heat transfer medium line have a resonant frequency of approximately the predetermined frequency.

9. The high impedance conduit of claim 1, wherein the components are incorporated in a semiconductor manufacturing system.

10. The high impedance liquid heat transfer medium conduit of claim 1, wherein the coiled liquid heat transfer medium line comprises an electrically insulating material.

11. A high impedance liquid heat transfer medium conduit configured for a heat transfer system using heat exchange medium in thermal and electrical contact with a component to be thermally conditioned which is energized by radio frequency power of a predetermined frequency, the conduit comprising:
   a coiled liquid heat transfer medium line; and
   a capacitive element operatively connected in parallel with the coiled liquid heat transfer medium line, the coiled line and capacitive element collectively constituting a parallel LC circuit resonant at a frequency approximating the predetermined frequency; wherein the coiled line comprises a first coiled line configured to supply heat transfer liquid medium from a liquid supply to the component to be thermally-conditioned, the conduit further comprising:
   a second coiled liquid heat transfer medium line having an inherent inductance L when filled with a conductive fluid used as a liquid heat transfer medium;

a second capacitive element operatively connected in parallel with the second coiled liquid heat transfer medium line, the second capacitive element having a capacitance such that a resonant frequency of the second coiled liquid heat transfer medium line and the second capacitive element is approximately the predetermined frequency so that the conduit has a high impedance with respect to the components being thermally conditioned, minimizing electrical power loss, the second coiled liquid heat transfer medium line configured to be used to return liquid heat transfer medium to the liquid supply.

12. The high impedance liquid heat transfer medium conduit of claim 11, wherein the first and second coiled liquid heat transfer medium lines comprise an electrically insulating material.

13. A semiconductor wafer processing system comprising:
   a vacuum processing chamber;
   a thermally conditioned component selected from the group consisting of a wafer support, a sputter target support, a seal, a coil and a process gas distribution element;
   an RF supply operating at a predetermined frequency connected to energize said thermally conditioned component with RF energy;
   a high impedance liquid heat transfer medium conduit configured for a heat transfer system using heat exchange medium in thermal and electrical contact with said component to be thermally conditioned which is energized by radio frequency power of the predetermined frequency, the conduit comprising:
      a first coiled liquid heat transfer medium line connected between said component and a supply of liquid heat transfer medium, and
      a first capacitive element operatively connected in parallel with the coiled liquid heat transfer medium line, the coiled line and capacitive element collectively constituting a parallel LC circuit resonant at a frequency approximating the predetermined frequency.

14. The semiconductor wafer processing system of claim 13, wherein the first coiled liquid heat transfer medium line comprises an electrically insulating material.

15. A semiconductor wafer processing system comprising:
   a vacuum processing chamber;
   a thermally conditioned component selected from the group consisting of a wafer support, a sputter target support, a seal, a coil and a process gas distribution element;
   an RF supply operating at a predetermined frequency connected to energize said thermally conditioned component with RF energy;
   a high impedance liquid heat transfer medium conduit configured for a heat transfer system using heat exchange medium in thermal and electrical contact with said component to be thermally conditioned which is energized by radio frequency power of the predetermined frequency, the conduit comprising:
      a first coiled liquid heat transfer medium line connected between said component and a supply of liquid heat transfer medium, and
      a first capacitive element operatively connected in parallel with the coiled liquid heat transfer medium line, the coiled line and capacitive element collectively constituting a parallel LC circuit resonant at a frequency approximating the predetermined frequency;
   a second coiled line is configured to supply heat transfer liquid medium from a liquid supply to said thermally conditioned component, the conduit further comprising:
      a second coiled liquid heat transfer medium line having an inherent inductance L when filled with a conductive fluid used as a liquid heat transfer medium;
      a second capacitive element operatively connected in parallel with the second coiled liquid heat transfer medium line, the second capacitive element having a capacitance such that a resonant frequency of the second coiled liquid heat transfer medium line and the second capacitive element approximates the predetermined frequency so that the conduit has a high impedance with respect to said thermally conditioned component, minimizing electrical power loss, the second coiled liquid heat transfer medium line configured to be used to return liquid heat transfer medium to the liquid supply; and
      the first coiled line is configured to supply liquid heat transfer medium to said thermally conditioned component.

16. The semiconductor wafer processing system of claim 15, wherein the first and second coiled liquid heat transfer medium lines comprise an electrically insulating material.

* * * * *